US010608351B2

(12) United States Patent
Qian et al.

(10) Patent No.: US 10,608,351 B2
(45) Date of Patent: Mar. 31, 2020

(54) SPRING AND TERMINAL

(71) Applicant: Huawei Technologies Co., Ltd., Shenzhen (CN)

(72) Inventors: Zaijun Qian, Shanghai (CN); Hongwei Wang, Shanghai (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 16/308,300

(22) PCT Filed: Apr. 13, 2017

(86) PCT No.: PCT/CN2017/080483

§ 371 (c)(1),
(2) Date: Dec. 7, 2018

(87) PCT Pub. No.: WO2018/120505

PCT Pub. Date: Jul. 5, 2018

(65) Prior Publication Data

US 2019/0148846 A1 May 16, 2019

(30) Foreign Application Priority Data

Dec. 26, 2016 (CN) .......................... 2016 1 1220996

(51) Int. Cl.
*H01R 4/48* (2006.01)
*H01R 12/71* (2011.01)
(Continued)

(52) U.S. Cl.
CPC ........... *H01R 4/48* (2013.01); *H01R 12/7076* (2013.01); *H01R 12/71* (2013.01); *H01R 13/24* (2013.01);
(Continued)

(58) Field of Classification Search
CPC .... H01R 4/48; H01R 12/707; H01R 12/7076; H01R 12/71; H01R 13/24; H01R 13/2407;
(Continued)

(56) References Cited

U.S. PATENT DOCUMENTS 5,596,170 A * 1/1997 Barina ............... H01R 13/2407 174/366
5,600,092 A * 2/1997 Patscheck ................ H01R 4/64 174/351
(Continued)

FOREIGN PATENT DOCUMENTS

CN 101170646 A 4/2008
CN 201478544 U 5/2010
(Continued)

OTHER PUBLICATIONS

Machine Translation and Abstract of Chinese Publication No. CN203415732, Jan. 29, 2014, 10 pages.
(Continued)

*Primary Examiner* — Oscar C Jimenez
(74) *Attorney, Agent, or Firm* — Conley Rose, P.C.

(57) ABSTRACT

A spring and a terminal relate to the technical field of electric connection structures and applied to a grounding connection of a camera inside the terminal, where a fitting component can be inserted into the spring in any side direction and elastically connected to the spring such that a sequence of assembling and disassembling the fitting component can be freely selected. The spring includes a mounting bracket and a contact part that are successively arranged in a first direction, the contact part is coupled to the mounting bracket using at least three elastic limiting arms, and the at least three elastic limiting arms are disposed at an even interval on one end of the contact part proximate the mounting bracket.

20 Claims, 7 Drawing Sheets

10
1
11
11
2
7
4
34
33
31
32
3

(51) Int. Cl.
*H01R 13/24* (2006.01)
*H01R 12/70* (2011.01)
*H05K 1/18* (2006.01)

(52) U.S. Cl.
CPC ....... *H01R 13/2407* (2013.01); *H01R 12/707* (2013.01); *H05K 1/182* (2013.01); *H05K 2201/10121* (2013.01); *H05K 2201/10265* (2013.01)

(58) Field of Classification Search
CPC ......... H05K 1/182; H05K 2201/10121; H05K 2201/10265
See application file for complete search history.

(56) References Cited

U.S. PATENT DOCUMENTS

| | | | | |
|---|---|---|---|---|
| 6,626,708 | B2 * | 9/2003 | Phillips | H01R 13/2428 439/515 |
| 7,989,045 | B2 * | 8/2011 | Chang | H01R 12/57 174/366 |
| 8,052,428 | B2 * | 11/2011 | Tsao | H01R 13/24 439/66 |
| 2003/0104731 | A1 | 6/2003 | Chang | |
| 2006/0138676 | A1 | 6/2006 | Haga | |
| 2008/0174692 | A1 | 7/2008 | Kusaki et al. | |
| 2009/0130899 | A1 * | 5/2009 | Lin | H01R 13/6275 439/571 |
| 2011/0104958 | A1 * | 5/2011 | Kwon | H01M 2/105 439/816 |
| 2012/0164855 | A1 | 6/2012 | Zhang et al. | |
| 2015/0340789 | A1 * | 11/2015 | Yokota | H01R 13/2407 439/816 |
| 2016/0006158 | A1 * | 1/2016 | Lu | G06K 13/08 439/630 |
| 2016/0294095 | A1 * | 10/2016 | Kim | H01R 12/714 |
| 2017/0358884 | A1 | 12/2017 | Yokota et al. | |
| 2018/0358726 | A1 * | 12/2018 | Hur | H01R 12/7076 |
| 2019/0097345 | A1 * | 3/2019 | Mori | H01R 13/2428 |
| 2019/0190184 | A1 * | 6/2019 | Nakamura | H01R 12/71 |

FOREIGN PATENT DOCUMENTS

| | | | |
|---|---|---|---|
| CN | 202972406 | U | 6/2013 |
| CN | 203415732 | U | 1/2014 |
| CN | 205159541 | U | 4/2016 |
| CN | 205723971 | U | 11/2016 |
| CN | 206340715 | U | 7/2017 |
| EP | 2947721 | A2 | 11/2015 |
| JP | 2008113066 | A | 5/2008 |
| JP | 2016001583 | A | 1/2016 |
| KR | 20160110074 | A | 9/2016 |
| WO | 2005057734 | A1 | 6/2005 |

OTHER PUBLICATIONS

Machine Translation and Abstract of Chinese Publication No. CN205159541, Apr. 13, 2016, 7 pages.

Foreign Communication From a Counterpart Application, Chinese Application No. 201780009702.8, Chinese Office Action dated Mar. 28, 2019, 6 pages.

Machine Translation and Abstract of Chinese Publication No. CN202972406, Jun. 5, 2013, 10 pages.

Machine Translation and Abstract of Chinese Publication No. CN205723971, Nov. 23, 2016, 14 pages.

Foreign Communication From a Counterpart Application, PCT Application No. PCT/CN2017/080483, English Translation of International Search Report dated Sep. 21, 2017, 2 pages.

Machine Translation and Abstract of Korean Publication No. KR20160110074, Sep. 21, 2016, 18 pages.

Foreign Communication From a Counterpart Application, European Application No. 17885692.8, Extended European Search Report dated Apr. 1, 2019, 8 pages.

Machine Translation and Abstract of Chinese Publication No. CN201478544, dated May 19, 2010, 24 pages.

Machine Translation and Abstract of Japanese Publication No. JP2008113066, dated May 15, 2008, 30 pages.

Foreign Communication From a Counterpart Application, Japanese Application No. 2018/557023, Japanese Office Action dated Nov. 1, 2019, 3 pages.

Foreign Communication From a Counterpart Application, Japanese Application No. 2018/557023, English Translation of Japanese Office Action dated Nov. 1, 2019, 3 pages.

Machine Translation and Abstract of Chinese Publication No. CN206340715, dated Jul. 18, 2017, 6 pages.

Foreign Communication From a Counterpart Application, Chinese Application No. 201780009702.8, Chinese Office Action dated Oct. 25, 2019, 7 pages.

* cited by examiner

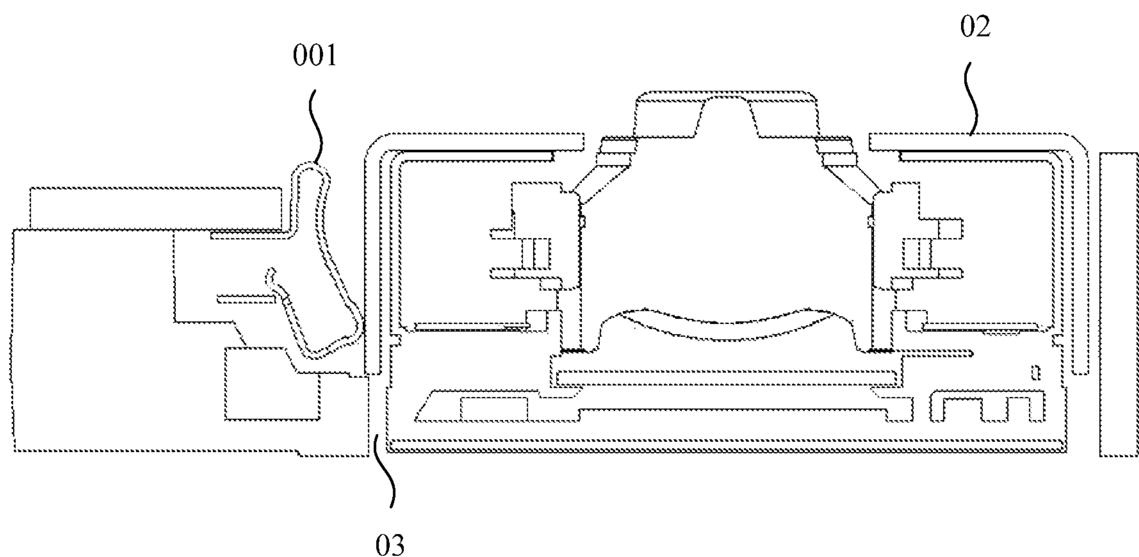
FIG. 5 PRIOR ART
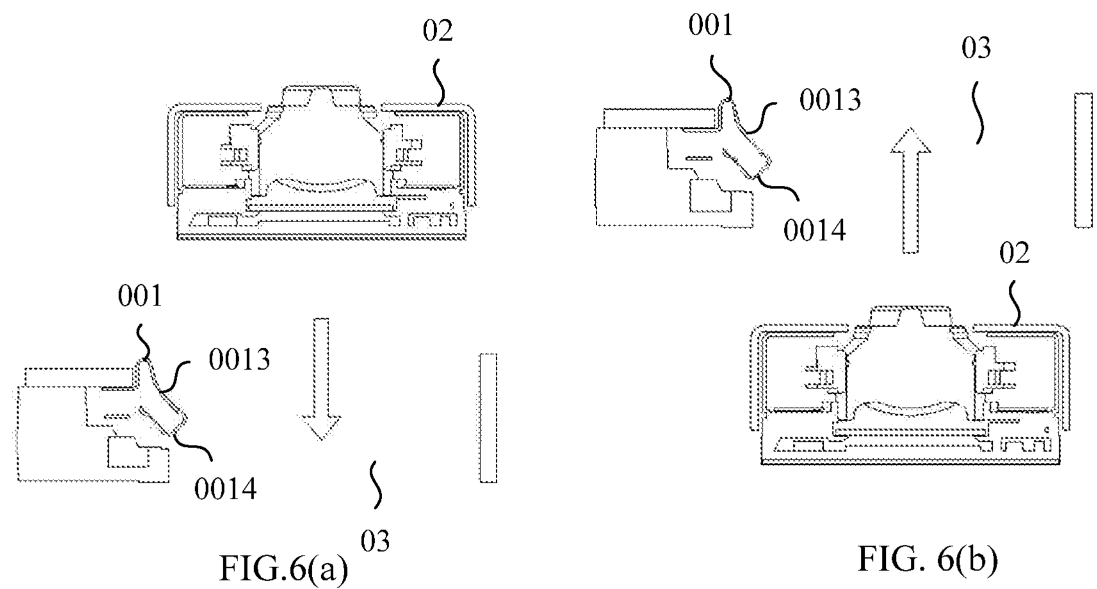
FIG.6(a)
FIG. 6(b)
PRIOR ART

SPRING AND TERMINAL

CROSS-REFERENCE TO RELATED APPLICATIONS

This application is a U.S. National Stage of International Patent Application No. PCT/CN2017/080483 filed on Apr. 13, 2017, which claims priority to Chinese Patent Application No. 201611220996.2 filed on Dec. 26, 2016. Both of the aforementioned application, are hereby incorporated by reference in their entireties.

TECHNICAL FIELD

This application relates to the field of terminal technologies, and in particular, to a spring and a terminal.

BACKGROUND

With increasing functions of an electronic product and increasing requirements from people on security performance of an electronic product, in an electronic product system, a spring configured to connect a circuit board to some other electronic components having special functions is widely applied.

For example, FIG. 1 is a spring provided in the prior art. Referring to FIG. 1, a spring 01 includes a mounting bracket 011 welded to a circuit board, and a contact part 012 located on one side of the mounting bracket 011. An elastic limiting arm 013 is disposed between a lower end of the contact part 012 and the mounting bracket 011. To facilitate an elastic connection between an electronic component and the spring 01, the electronic component is usually inserted into the spring 01 in a forward direction (that is, from one side that is of the contact part 012 and that is away from the mounting bracket 011 in a direction of approaching the contact part 012, where for details, refer to a direction a in FIG. 1), and is elastically connected to the spring 01. However, when it is inconvenient or there is no sufficient space for the electronic component to insert into the spring 01 in a forward direction, the electronic component needs to be inserted into the spring 01 in a side direction (that is, a direction perpendicular to the direction a, for example, a direction c in FIG. 1), and is elastically connected to the spring 01. However, when the electronic component is inserted into the spring 01 in a side direction, a structure of the spring usually imposes a special requirement on a side direction in which the electronic component is inserted. For example, FIG. 2 is a schematic structural diagram obtained after the spring shown in FIG. 1 is mounted inside a terminal. Referring to FIG. 2, a mounting groove 03 used to mount a camera 02 is formed inside the terminal, the spring 01 is fixed on one side of the mounting groove 03, and the contact part stretches into the mounting groove 03. Referring to FIG. 3, the camera 02 can be smoothly inserted into mounting groove 03 and elastically connected to the spring 01 only when being inserted in a lower direction (that is, a direction c shown in FIG. 1) of the mounting groove 03. However, when the camera 02 is inserted into the mounting groove 03 in an upper direction (that is, a direction b in FIG. 1) of the mounting groove 03, the contact part 012 is likely to move downward, the elastic limiting arm 013 encounters elastic limit deformation or tearing, and a turnup edge generated after the spring 01 is deformed is likely to scratch the camera 02.

To resolve the foregoing problems, the prior art provides another spring. As shown in FIG. 4, a spring 001 includes a mounting bracket 0011 welded to a circuit board, and a contact part 0012 located on one side of the mounting bracket 0011. A first elastic limiting arm 0013 is disposed between an upper end of the contact part 0012 and the mounting bracket 0011, and a second elastic limiting arm 0014 is disposed between a lower end of the contact part 0012 and the mounting bracket 0011. FIG. 5 is a schematic structural diagram obtained after the spring 01 inside the terminal shown in FIG. 2 is replaced with the spring 001 shown in FIG. 4. As shown in FIG. 6(*a*) and FIG. 6(*b*), due to limiting functions of the first elastic limiting arm 0013 and the second elastic limiting arm 0014, the camera 02 can be smoothly inserted into the mounting groove 03 in either an upper direction or a lower direction of the mounting groove 03. However, when the camera is inserted into the mounting groove 03 in another side direction (for example, a direction d or a direction e shown in FIG. 4) of the spring 001, and is elastically connected to the spring 001, the spring 001 also encounters elastic limit deformation or tearing, and a turnup edge generated after the spring 001 is deformed is likely to scratch the camera.

Based on the foregoing descriptions, both the springs shown in FIG. 1 and FIG. 4 impose a special requirement on a side direction in which the electronic component is inserted, and therefore impose a requirement on a sequence of assembling and disassembling the electronic component. Consequently, assembly and disassembly efficiency and a yield of the electronic component are reduced.

SUMMARY

Embodiments of this application provide a spring and a terminal. A fitting component can be inserted into the spring in any side direction and elastically connected to the spring, so that a sequence of assembling and disassembling the fitting component can be freely selected, thereby improving assembly and disassembly efficiency and a yield of the fitting component.

To achieve the foregoing objective, the embodiments of this application use the following technical solutions.

According to a first aspect, this application provides a spring, including a mounting bracket and a contact part that are successively arranged in a first direction, where the contact part is connected to the mounting bracket by using at least three elastic limiting arms, and the at least three elastic limiting arms are disposed at an even interval on one end that is of the contact part and that is near the mounting bracket.

In the spring provided in this embodiment of this application, the contact part is connected to the mounting bracket by using the at least three elastic limiting arms, and the at least three elastic limiting arms are disposed at an even interval on the one end that is of the contact part and that is near the mounting bracket. Therefore, the at least three elastic limiting arms may limit the contact part in any side direction of the contact part, to prevent the spring from encountering elastic limit deformation or tearing when a fitting component is inserted in any side direction of the contact part, so that the fitting component can be inserted in any side direction of the spring and elastically connected to the spring, and a sequence of assembling and disassembling the fitting component can be freely selected, thereby improving assembly and disassembly efficiency and a yield of the fitting component.

In a first optional implementation of the first aspect, there are four elastic limiting arms, and the four elastic limiting arms include a first elastic limiting arm and a second elastic limiting arm that are oppositely disposed, and a third elastic limiting arm and a fourth elastic limiting arm that are oppositely disposed. There are four elastic limiting arms. Therefore, limiting stability is high, a quantity of elastic limiting arms to be disposed is small, and costs are low.

In a second optional implementation of the first aspect, two ends of the first elastic limiting arm and/or the second elastic limiting arm are respectively fixedly connected to the contact part and the mounting bracket, the third elastic limiting arm and the fourth elastic limiting arm extend from one end that is of the contact part and that is near the mounting bracket, alar parts are disposed in a direction in which the third elastic limiting arm and the fourth elastic limiting arm extend, the alar parts are fixed at the mounting bracket, tail ends of the third elastic limiting arm and the fourth elastic limiting arm press against inner side walls of the alar parts, and when a fitting component is inserted into the spring and is elastically connected to the contact part, the tail ends of the third elastic limiting arm and the fourth elastic limiting arm can slide along the inner side walls of the alar parts in a direction of approaching the mounting bracket. Therefore, while implementing limiting, elasticity of the spring can be increased, an insertion force required when the fitting component is inserted in a side direction of the spring can be reduced, and an insertion difficult can be reduced.

In a third optional implementation of the first aspect, the first elastic limiting arm includes a first elastic segment formed after the first elastic limiting arm extends from one end that is of the contact part and that is near the mounting bracket, a first straining segment formed after the first elastic limiting arm is reversely bent from a tail end of the first elastic segment in a direction of approaching the mounting bracket, and a first support segment formed after the first elastic limiting arm extends from a tail end of the first straining segment in a direction opposite to an extending direction of the first elastic segment, where a tail end of the first support segment is connected to the mounting bracket. An extension path of the first elastic limiting arm is reversely bent, so that a volume of a structure including the mounting bracket and the alar parts can be reduced while ensuring an elastic arm of force.

In a fourth optional implementation of the first aspect, the second elastic limiting arm includes a second elastic segment formed after the second elastic limiting arm extends from one end that is of the contact part and that is near the mounting bracket, a second straining segment formed after the second elastic limiting arm is reversely bent from a tail end of the second elastic segment in a direction of approaching the mounting bracket, and a second support segment formed after the second elastic limiting arm extends from a tail end of the second straining segment in a direction opposite to an extending direction of the second elastic segment, where a tail end of the second support segment is connected to the mounting bracket. An extension path of the second elastic limiting arm is reversely bent, so that a volume of a structure including the mounting bracket and the alar parts can be reduced while ensuring an elastic arm of force.

In a fifth optional implementation of the first aspect, one end that is of the second support segment and that is connected to the second straining segment is fixed, and the other end inclines toward a direction of keeping away from the contact part, a sliding part is fixed at one end that is of the second support segment and that is away from the second straining segment, a chute that extends in the direction opposite to the extending direction of the second elastic segment is disposed on the alar part, the sliding part is fitted at a start end of the chute, and when the fitting component is inserted into the spring and is elastically connected to the contact part, the sliding part can slide along the chute in a direction of approaching a tail end of the chute. The sliding part fits the chute, so that the second elastic limiting arm is flexibly connected to the alar part, thereby further increasing elasticity of the spring, reducing an insertion force required when the fitting component is inserted in a side direction of the spring, and reducing an insertion difficulty.

In a sixth optional implementation of the first aspect, the start end of the chute is fixed, and the tail end of the chute inclines toward the direction of keeping away from the contact part. The tail end of the chute inclines toward the direction of keeping away from the contact part, so that an elastic force is eliminated, thereby reducing a possibility that the spring encounters elastic limit deformation when the component is elastically connected to the spring.

In a seventh optional implementation of the first aspect, a surface that is on the sliding part and that is in contact with an inner wall of the chute is an arc surface. This prevents the sliding part from being stuck when sliding in the chute.

In an eighth optional implementation of the first aspect, ends of the third elastic limiting arm and the fourth elastic limiting arm that are connected to the contact part are fixed, and the other ends incline toward a direction of approaching the mounting bracket. In this way, when the fitting component is inserted into the spring from one side that is of the contact part and that is connected to the third elastic limiting arm or the fourth elastic limiting arm, and is elastically connected to the contact part, the third elastic limiting arm and the fourth elastic limiting arm may help the fitting component to be smoothly inserted into the spring and to press against the contact part.

In a ninth optional implementation of the first aspect, one end that is of the first elastic segment and that is connected to the contact part is fixed, and the other end inclines toward a direction of approaching the mounting bracket. In this way, when the fitting component is inserted into the spring from one side that is of the contact part and that is connected to the first elastic segment, and is elastically connected to the contact part, the first elastic segment may help the fitting component to be smoothly inserted into the spring and to press against the contact part.

In a tenth optional implementation of the first aspect, one end that is of the second elastic segment and that is connected to the contact part is fixed, and the other end inclines toward a direction of approaching the mounting bracket. In this way, when the fitting component is inserted into the spring from one side that is of the contact part and that is connected to the second elastic segment, and is elastically connected to the contact part, the second elastic segment may help the fitting component to be smoothly inserted into the spring and to press against the contact part.

In an eleventh optional implementation of the first aspect, a tail end of the alar part in the first direction is bent in a direction of approaching the contact part to form a limiting part, so as to prevent tail ends of the third elastic limiting arm and the fourth elastic limiting arm from moving along an inner side wall of the alar part in a direction of keeping away from the mounting bracket and detaching from the inner side wall of the alar part, thereby ensuring stability of limiting the contact part by the third elastic limiting arm and the fourth elastic limiting arm.

In a twelfth optional implementation of the first aspect, ends that are of the third elastic limiting arm and the fourth elastic limiting arm and that are connected to the contact part are fixed, the other ends incline toward a direction of approaching the mounting bracket, the other ends of the third elastic limiting arm and the fourth elastic limiting arm are bent in a direction of approaching the limiting part to form a hook-shaped part, and a surface that is of the hook-shaped part and that is near the limiting part fits a surface of the limiting part. The surface of the hook-shaped part fits the surface of the limiting part, so that limiting stability of the limiting part is improved.

In a thirteenth optional implementation of the first aspect, a surface that is on the contact part and that is away from the mounting bracket is used to contact the fitting component, and the surface that is on the contact part and that is away from the mounting bracket is a convex spherical surface, so as to prevent the fitting component from being scratched by the contact part when the fitting component is elastically connected to the contact part.

In a fourteenth optional implementation of the first aspect, the spring is integrally formed by using a stamping molding method, a molding process is less time-consuming, and molding efficiency is high.

According to a second aspect, this application provides a terminal, including a terminal body and a camera, where a mounting groove is formed on the terminal body, the camera is mounted inside the mounting groove, a spring is disposed on one side of the mounting groove, the spring is the spring in any one of the foregoing technical solutions, a mounting bracket of the spring is fixed on the terminal body, and a contact part of the spring presses against a side wall of the camera.

In the terminal provided in this embodiment of this application, because the spring inside the terminal is the spring in any one of the foregoing technical solutions, an elastic connection between the camera and the spring can be successfully implemented regardless of an aperture that is of the mounting groove and from which the camera is inserted into the mounting groove, so that a sequence of assembling and disassembling the camera can be freely selected, thereby improving assembly and disassembly efficiency and a yield of the terminal.

BRIEF DESCRIPTION OF DRAWINGS

The following briefly describes the accompanying drawings required for describing the embodiments or the prior art.

FIG. 5 is a schematic structural diagram of a cross section of a terminal on which a spring shown in FIG. 4 is mounted;

FIG. 6(*a*) is a schematic diagram of a first side direction that is allowed by a spring in a terminal shown in FIG. 5 and in which a camera is inserted;

FIG. 6(*b*) is a schematic diagram of a second side direction that is allowed by a spring in a terminal shown in FIG. 5 and in which a camera is inserted;

DESCRIPTION OF EMBODIMENTS

The following describes the technical solutions in the embodiments of this application with reference to the accompanying drawings in the embodiments of this application.

In the descriptions of this application, directions or position relationships indicated by the terms “center”, “up”, “down”, “front”, “rear”, “left”, “right”, “vertical”, “horizontal”, “top”, “bottom”, “inside”, “outside”, and the like are based on the directions or position relationships shown in the accompanying drawings, and are merely intended to describe this application and simplify the descriptions, but are not intended to indicate or imply that an apparatus or a component shall have a specific direction or be formed and operated in a specific direction, and therefore shall not be understood as a limitation on this application.

In the descriptions of this application, it should be noted that the terms “mounting” and “connection” should be understood in a broad sense unless otherwise expressly specified and limited, for example, may be a fixed connection, or may be a detachable connection, or may be a contact connection or an integral connection. For persons of ordinary skill in the art, specific meanings of the foregoing terms in this application may be understood based on a specific situation.

Figure 1:
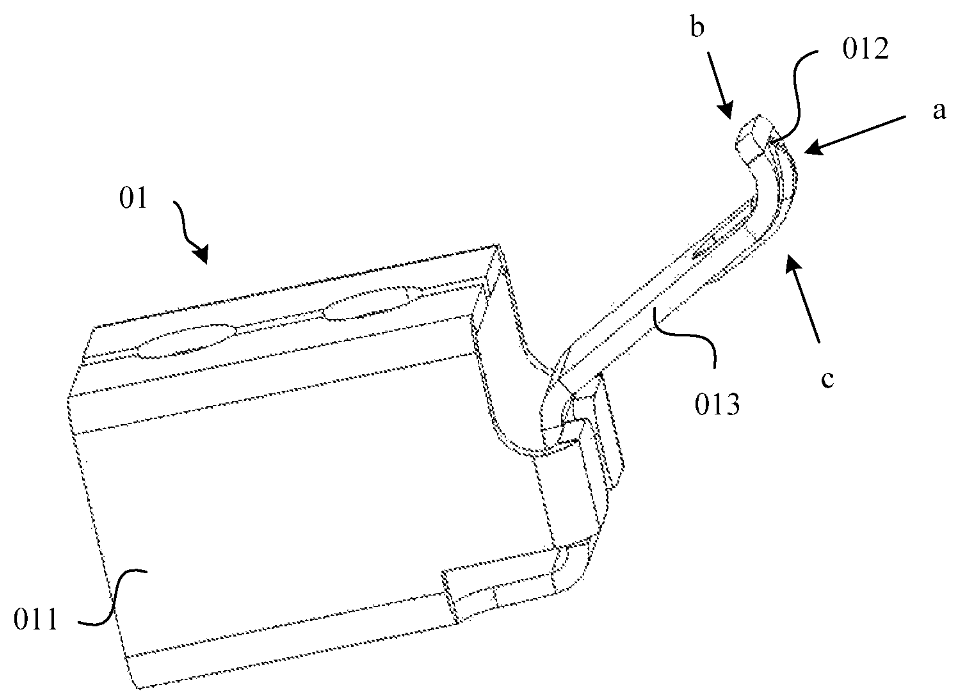
FIG. 1 is a schematic structural diagram of a spring in the prior art.
Figure 2:
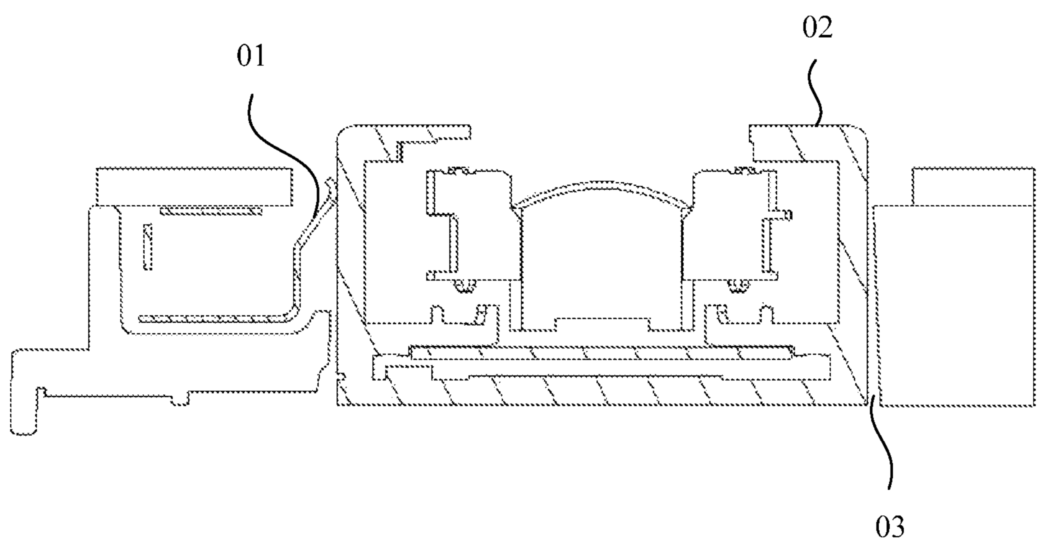
FIG. 2 is a schematic structural diagram of a cross section of a terminal on which a spring shown in FIG. 1 is mounted.
Figure 3:
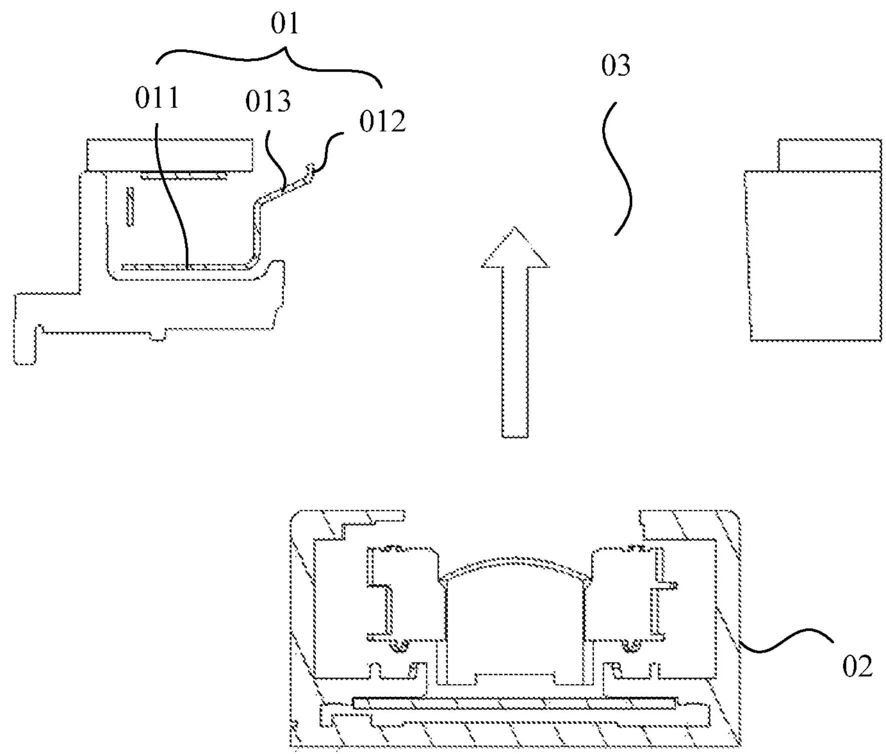
FIG. 3 is a schematic diagram of a side direction that is allowed by a spring in a terminal shown in FIG. 2 and in which a camera is inserted.
Figure 4:
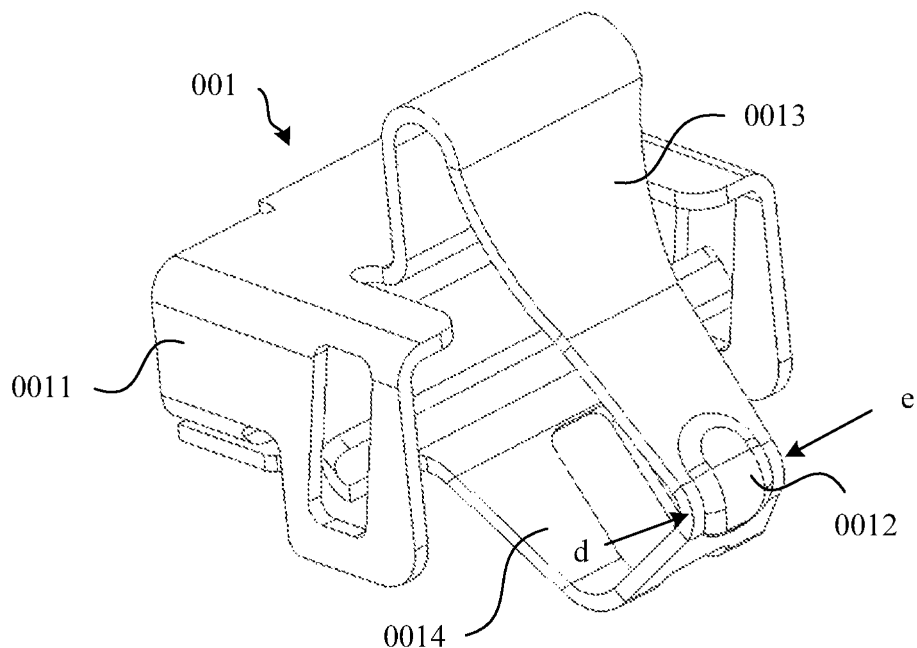
FIG. 4 is a schematic structural diagram of another spring in the prior art.
Figure 7:
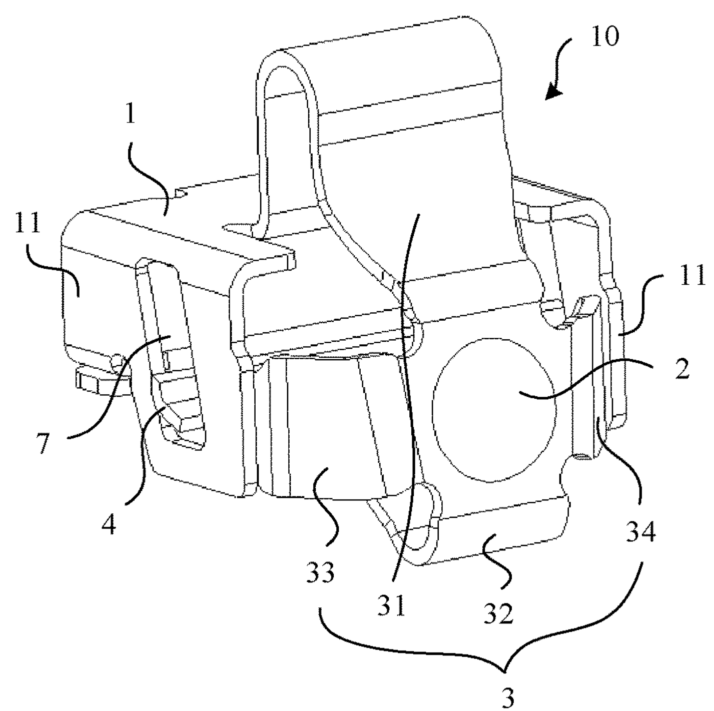
FIG. 7 is a schematic structural diagram of a spring according to an embodiment of this application.
Figure 8:
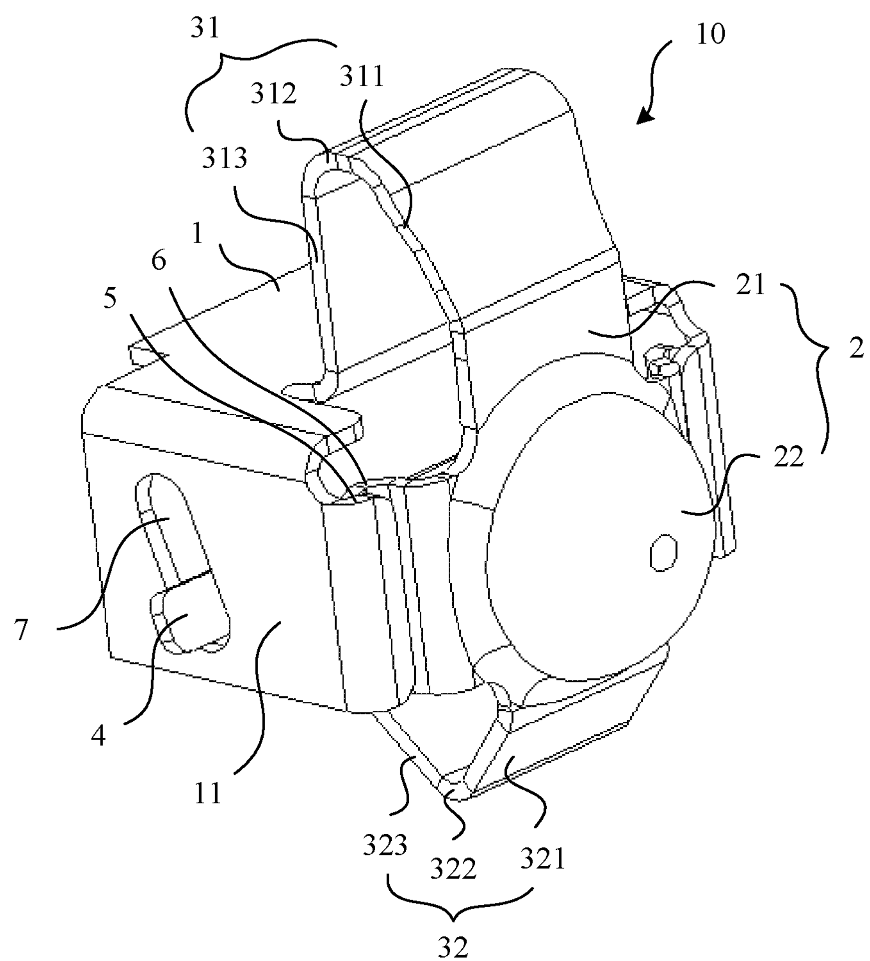
FIG. 8 is another schematic structural diagram of a spring according to an embodiment of this application.

An embodiment of this application provides a spring 10. Referring to FIG. 7 or FIG. 8, the spring 10 includes a mounting bracket 1 and a contact part 2 that are successively arranged in a first direction. The contact part 2 is connected to the mounting bracket 1 by using at least three elastic limiting arms 3, and the at least three elastic limiting arms 3 are disposed at an even interval on one end that is of the contact part 2 and that is near the mounting bracket 1.

In the spring 10 provided in this embodiment of this application, the contact part 2 is connected to the mounting bracket 1 by using the at least three elastic limiting arms 3, and the at least three elastic limiting arms 3 are disposed at an even interval on the one end that is of the contact part 2 and that is near the mounting bracket 1. Therefore, the at least three elastic limiting arms 3 may limit the contact part 2 in any side direction of the contact part 2, to prevent the spring 10 from encountering elastic limit deformation or tearing when a fitting component is inserted in any side direction of the contact part 2, so that a sequence of assembling and disassembling the fitting component can be freely selected, thereby improving assembly and disassembly efficiency and a yield of the fitting component.

In the foregoing implementation, a quantity of elastic limiting arms 3 may be 3, 4, 5, 6, or the like. This is not specifically limited herein. The first direction may be straight up, straight down, horizontal left, horizontal right, or the like. This is not specifically limited herein. In addition, the spring 10 provided in this embodiment of this application may be applied to a terminal device, and may be specifically applied to grounding processing of a steel cover of a main camera inside the terminal and ground processing of a component nearby an antenna area. Certainly, the spring 10 provided in this embodiment of this application may be further applied to another electronic device. This is not specifically limited herein.

In the spring in this embodiment of this application, the mounting bracket 1 may be of a plate structure, a block structure, or the like. This is not specifically limited herein. Optionally, as shown in FIG. 7 or FIG. 8, the mounting bracket 1 is of a plate structure. This facilitates welding to a circuit board.

Optionally, as shown in FIG. 7 or FIG. 8, there are four elastic limiting arms 3. The four elastic limiting arms 3 include a first elastic limiting arm 31 and a second elastic limiting arm 32 that are oppositely disposed, and a third elastic limiting arm 33 and a fourth elastic limiting arm 34 that are oppositely disposed. The four elastic limiting arms limit the contact part 2 in four side directions of the contact part 2. Therefore, limiting stability is high, and a quantity of elastic limiting arms to be disposed is relatively small, and a manufacturing difficulty is relatively low.

Optionally, referring to FIG. 7 or FIG. 8, two ends of the first elastic limiting arm 31 and/or the second elastic limiting arm 32 are respectively fixedly connected to the contact part 2 and the mounting bracket 1, and the third elastic limiting arm 33 and the fourth elastic limiting arm 34 extend from one end that is of the contact part 2 and that is near the mounting bracket 1. Alar parts 11 are disposed in a direction in which the third elastic limiting arm 33 and the fourth elastic limiting arm 34 extend, the alar parts 11 are fixed at the mounting bracket 1, and tail ends of the third elastic limiting arm 33 and the fourth elastic limiting arm 34 press against inner side walls of the alar parts 11. When a fitting component is inserted into the spring 10 and is elastically connected to the contact part 2, the tail ends of the third elastic limiting arm 33 and the fourth elastic limiting arm 34 can slide along the inner side walls of the alar parts 11 in a direction of approaching the mounting bracket 1. Therefore, while limiting side-direction insertion into the spring 10, elasticity of the spring 10 can be increased, an insertion force required when the fitting component is inserted in a side direction of the spring 10 can be reduced, and a difficulty of inserting the fitting component can be reduced.

Optionally, referring to FIG. 8, the first elastic limiting arm 31 includes a first elastic segment 311 formed after the first elastic limiting arm 31 extends from one end that is of the contact part 2 and that is near the mounting bracket 1, a first straining segment 312 formed after the first elastic limiting arm 31 is reversely bent from a tail end of the first elastic segment 311 in a direction of approaching the mounting bracket 1, and a first support segment 313 formed after the first elastic limiting arm 31 extends from a tail end of the first straining segment 312 in a direction opposite to an extending direction of the first elastic segment 311. A tail end of the first support segment 313 is connected to the mounting bracket 1. Therefore, an extension path of the first elastic limiting arm 31 is reversely bent, so that a height of a structure including the mounting bracket 1 and the alar parts 11 in the extending direction of the first elastic segment 311 is reduced while ensuring an elastic arm of force (that is, a distance L1, shown in FIG. 9, from a bending point on the first straining segment 312 to an action line of a force F imposed on the contact part 2 when the fitting component is elastically connected to the contact part 2) of the spring 10, thereby reducing a volume of the structure including the mounting bracket 1 and the alar parts 11, and facilitating mounting of the spring 10 inside a small-sized electronic device.

Optionally, referring to FIG. 8, the second elastic limiting arm 32 includes a second elastic segment 321 formed after the second elastic limiting arm 32 extends from one end that is of the contact part 2 and that is near the mounting bracket 1, a second straining segment 322 formed after the second elastic limiting arm 32 is reversely bent from a tail end of the second elastic segment 321 in a direction of approaching the mounting bracket 1, and a second support segment 323 formed after the second elastic limiting arm 32 extends from a tail end of the second straining segment 322 in a direction opposite to an extending direction of the second elastic segment 321. A tail end of the second support segment 323 is connected to the mounting bracket 1. Therefore, an extension path of the second elastic limiting arm 32 is reversely bent, so that a height of a structure including the mounting bracket 1 and the alar parts 11 in the extending direction of the second elastic segment 321 is reduced while ensuring an elastic arm of force (a distance L2, shown in FIG. 9, from a bending point on the second straining segment 322 to an action line of a force F imposed on the contact part 2 when the fitting component is elastically connected to the contact part 2) of the spring 10, thereby reducing a volume of the structure including the mounting bracket 1 and the alar parts 11, and facilitating mounting of the spring 10 inside a small-sized electronic device.

To implement a connection between the tail end of the second support segment 323 and the mounting bracket 1, in a possible implementation, referring to FIG. 7 or FIG. 8, one end that is of the second support segment 323 and that is connected to the second straining segment 322 is fixed, and the other end inclines toward a direction of keeping away from the contact part 2, a sliding part 4 is fixed at one end that is of the second support segment 323 and that is away from the second straining segment 322, and a chute 7 that extends in the direction opposite to the extending direction of the second elastic segment 321 is disposed on the alar part 11, and the sliding part 4 is fitted at a start end of the chute 7. When the fitting component is inserted into the spring 10, and is elastically connected to the contact part, the sliding part 4 can slide along the chute 7 in a direction of approaching a tail end of the chute 7. Therefore, when the fitting component is inserted into the spring 10, one end that is of the second elastic limiting arm 32 and that is connected to the mounting bracket 1 may slide along the chute 7 in the direction of approaching the tail end of the chute 7, so that resistance generated when the fitting component is inserted into the spring 10 is reduced, thereby increasing elasticity of the spring 10, reducing a difficulty of inserting the fitting component, and reducing a possibility that the spring 10 encounters elastic limit deformation.

Optionally, referring to FIG. 7 or FIG. 8, the start end of the chute 7 is fixed, and the tail end of the chute 7 inclines toward the direction of keeping away from the contact part 2. Therefore, when the fitting component is elastically connected to the spring 10, the sliding part 4 may retreat in a direction of keeping away from the contact part 2 while sliding along the chute 7 in the direction of approaching the tail end of the chute 7, so that an elastic force of the spring 10 is eliminated, thereby reducing a possibility that the spring 10 encounters elastic limit deformation when the fitting component is elastically connected to the spring 10.

Optionally, referring to FIG. 7, a surface that is on the sliding part 4 and that is in contact with an inner wall of the chute 7 is an arc surface. Smooth performance of the arc surface is favorable, so as to prevent the sliding part 4 from being stuck in the chute 7.

In the foregoing implementation, the sliding part 4 may be of a cylindrical shape, or may be of an arc shape shown in FIG. 7, or may be of another shape. This is not specifically limited herein provided that the surface that is of the sliding part 4 and that is in contact with the inner wall of the chute 7 is the arc surface.

Optionally, referring to FIG. 7, ends of the third elastic limiting arm 33 and the fourth elastic limiting arm 34 that are connected to the contact part 2 are fixed, and the other ends incline toward a direction of approaching the mounting bracket 1. In this way, when the fitting component is inserted into the spring 10 from one side that is of the contact part 2 and that is connected to the third elastic limiting arm 33 or the fourth elastic limiting arm 34, and is elastically connected to the contact part 2, the third elastic limiting arm 33 and the fourth elastic limiting arm 34 may help the fitting component to be smoothly inserted into the spring 10 and to press against the contact part 2, so as to reduce a difficulty that the fitting component is inserted from the one side that is of the contact part 2 and that is connected to the third elastic limiting arm 33 or the fourth elastic limiting arm 34.

Optionally, referring to FIG. 8, one end that is of the first elastic segment 311 and that is connected to the contact part 2 is fixed, and the other end inclines toward a direction of approaching the mounting bracket 1. In this way, when the fitting component is inserted into the spring 10 from one side that is of the contact part 2 and that is connected to the first elastic limiting arm 31, and is elastically connected to the contact part 2, the first elastic segment 311 may help the fitting component to be smoothly inserted into the spring 10 and to press against the contact part 2, so as to reduce a difficulty that the fitting component is inserted from the one side that is of the contact part 2 and that is connected to the first elastic limiting arm 31.

Optionally, referring to FIG. 8, one end that is of the second elastic segment 321 and that is connected to the contact part 2 is fixed, and the other end inclines toward a direction of approaching the mounting bracket 1. In this way, when the fitting component is inserted into the spring 10 from one side that is of the contact part 2 and that is connected to the second elastic limiting arm 32, and is elastically connected to the contact part 2, the second elastic segment 321 may help the component to be smoothly inserted into the spring 10 and to press against the contact part 2, so as to reduce a difficulty that the fitting component is inserted from the one side that is of the contact part 2 and that is connected to the second elastic limiting arm 32.

Optionally, referring to FIG. 8, a tail end of the alar part 11 in the first direction is bent in a direction of approaching the contact part 2 to form a limiting part 5. In this case, when the fitting component is inserted into the spring 10 from one side that is of the contact part 2 and that is connected to the third elastic limiting arm 33 or the fourth elastic limiting arm 34, the limiting part 5 may prevent tail ends of the third elastic limiting arm 33 and the fourth elastic limiting arm 34 from moving out from an inner side wall of the alar part 11, thereby stability of limiting the contact part 2 by the third elastic limiting arm 33 and the fourth elastic limiting arm 34.

Optionally, referring to FIG. 8, ends that are of the third elastic limiting arm 33 and the fourth elastic limiting arm 34 and that are connected to the contact part 2 are fixed, the other ends incline toward a direction of approaching the mounting bracket 1, and the other ends of the third elastic limiting arm 33 and the fourth elastic limiting arm 34 are bent in a direction of approaching the limiting part 5 to form a hook-shaped part 6. A surface that is of the hook-shaped 6 and that is near the limiting part 5 fits a surface of the limiting part 5. The surface of the hook-shaped part 6 fits the surface of the limiting part 5, so that stability of limiting the tail ends of the third elastic limiting arm 33 and the fourth elastic limiting arm 34 by the limiting part 5 is improved.

Optionally, referring to FIG. 7 or FIG. 8, a side surface that is on the contact part 2 and that is away from the mounting bracket 1 is used to contact the fitting component, and the surface that is on the contact part 2 and that is away from the mounting bracket 1 is a convex spherical surface. A surface of the convex spherical surface is smooth so as to prevent the fitting component from being scratched by the contact part 2 when the fitting component is inserted into the spring 10 in any side direction of the contact part 2 and is elastically connected to the contact part 2.

Specifically, referring to FIG. 8, the contact part 2 may include a support plate 21 and a convex spherical housing 22 formed through stamping on the support plate 21.

Optionally, the spring 10 is integrally formed by using a stamping molding method, an integral molding process is simple and less time-consuming, and molding efficiency is relatively high.

Figure 9:
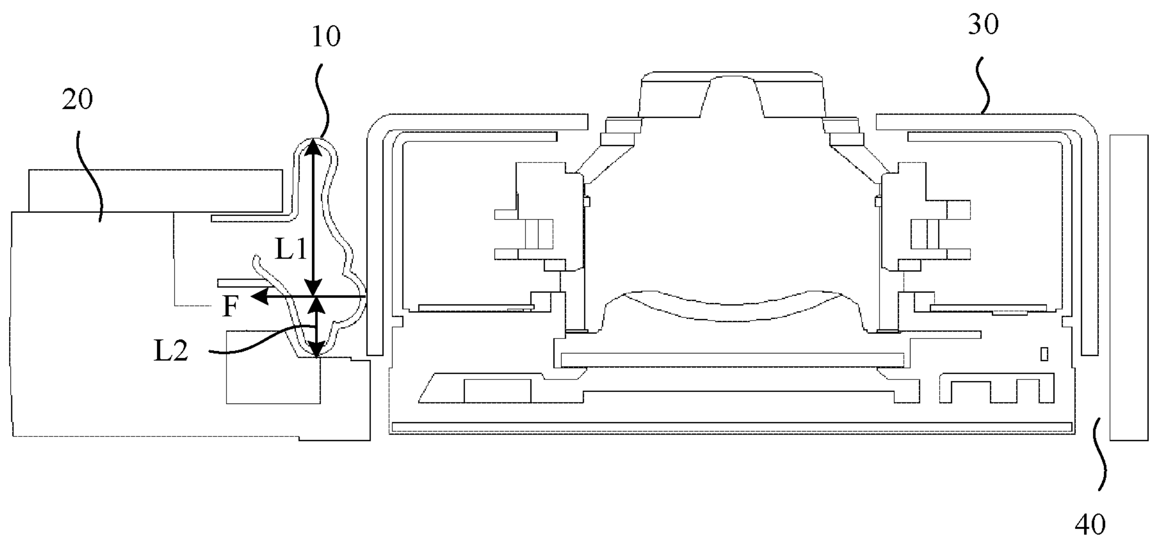
FIG. 9 is a schematic structural diagram of a cross section of a terminal according to an embodiment of this application.

FIG. 9 is a terminal according to an embodiment of this application. Referring to FIG. 9, the terminal includes a terminal body 20 and a camera 30. A mounting groove 40 is formed on the terminal body, the camera 30 is fitted inside the mounting groove 40, and a spring 10 is disposed on one side of the mounting groove 40. The spring 10 is the spring 10 in any one of the foregoing technical solutions, a mounting bracket of the spring 10 is fixed on the terminal body 20, and a contact part of the spring 10 presses against a side wall of the camera 30.

Figure 10:
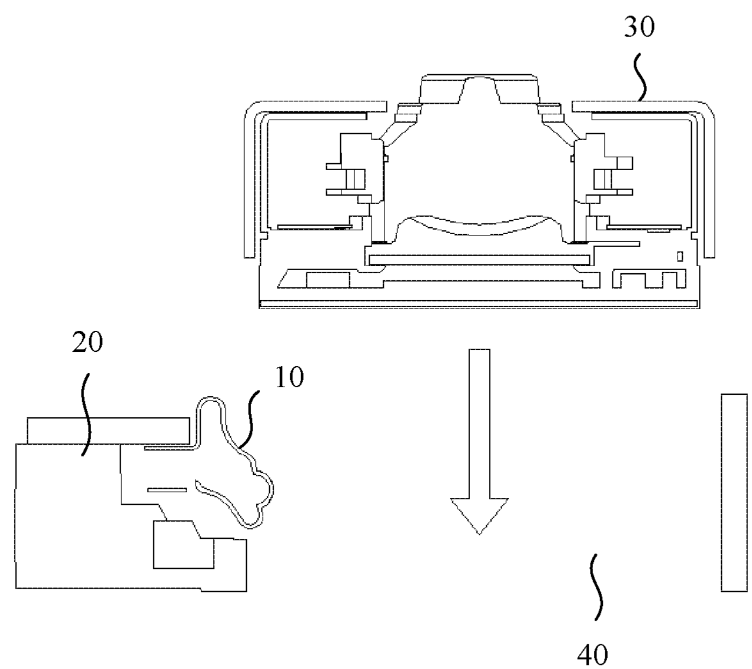
FIG. 10 is a schematic diagram of a first side direction that is allowed by a spring in a terminal shown in FIG. 9 and in which a camera is inserted.
Figure 11:
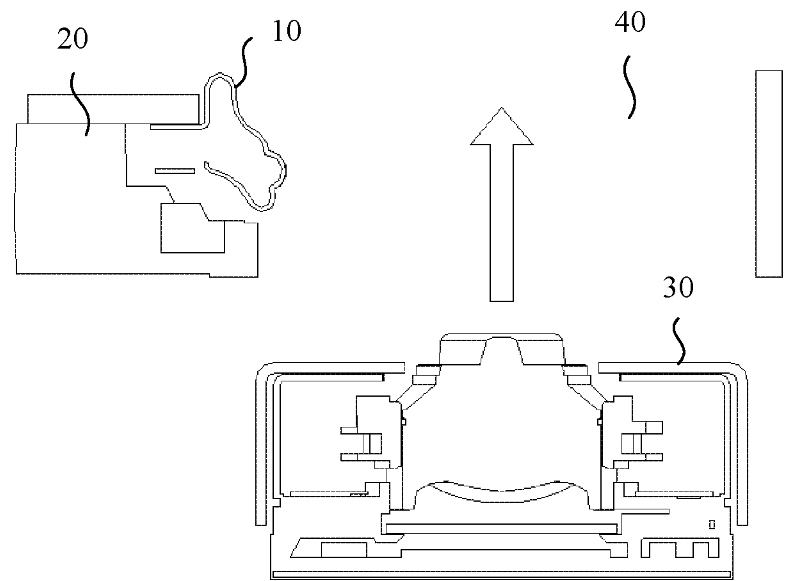
FIG. 11 is a schematic diagram of a second side direction that is allowed by a spring in a terminal shown in FIG. 9 and in which a camera is inserted.
Figure 12:
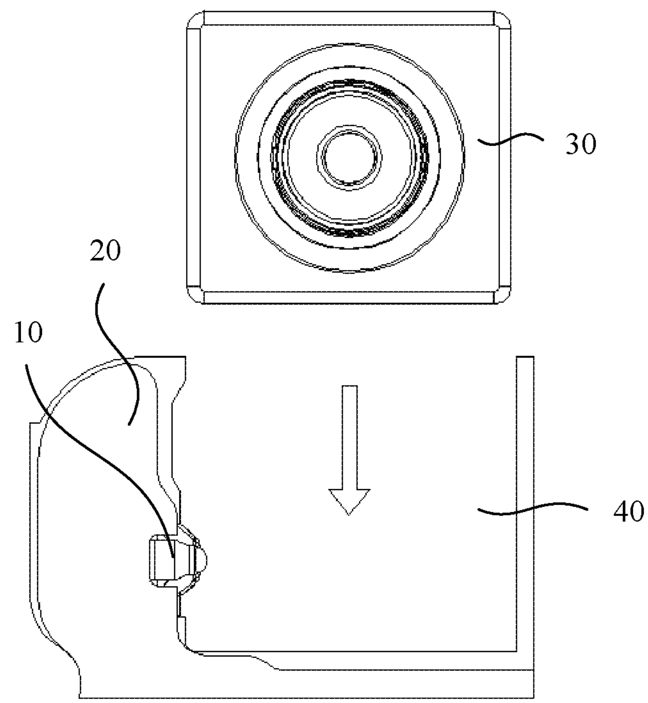
FIG. 12 is a schematic diagram of a third side direction that is allowed by a spring in a terminal shown in FIG. 9 and in which a camera is inserted.

In the terminal provided in this embodiment of this application, because the spring inside the terminal is the spring in any one of foregoing technical solutions, an elastic connection between the camera and the spring can be successfully implemented regardless of an aperture that is of the mounting groove and from which the camera is inserted into the mounting groove. For example, referring to FIG. 10 to FIG. 12, due to limiting functions of the four elastic limiting arms on the spring 10, the camera 30 can be successfully inserted into the mounting groove 40 and elastically connected to the spring 10 from an upper aperture of the mounting groove 40 (shown in FIG. 10), a lower aperture of the mounting groove 40 (shown in FIG. 11), and a rear aperture of the mounting groove 40 (shown in FIG. 12), so that a sequence of assembling and disassembling the camera 30 can be freely selected, thereby improving assembly and disassembly efficiency and a yield of the terminal.

In the descriptions of this specification, the specific features, structures, materials, or characteristics may be combined in a proper manner in any one or more of the embodiments or examples.

Finally, it should be noted that, the foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of this application.

What is claimed is:

1. A spring, comprising:

a mounting bracket arranged in a first direction;

a contact part arranged in the first direction and coupled to the mounting bracket by four elastic limiting arms, wherein two ends of a first elastic limiting arm or a second elastic limiting arm are respectively affixed to the contact part and the mounting bracket, and wherein a third elastic limiting arm and a fourth elastic limiting arm each extend from the contact part proximate to the mounting bracket at the other end; and alar parts affixed to the mounting bracket disposed in a direction in which the third elastic limiting arm and the fourth elastic limiting arm extend, wherein tail ends of the third elastic limiting arm and the fourth elastic limiting arm press against inner side walls of the alar parts, and wherein the tail ends of the third elastic limiting arm and the fourth elastic limiting arm are slidable along the inner side walls of the alar parts in a direction of approaching the mounting bracket when a fitting component is inserted into the spring and is elastically coupled to the contact part.

2. The spring of claim 1, wherein the first elastic limiting arm comprises a first elastic segment formed after the first elastic limiting arm extends from the one end of the contact part proximate the mounting bracket, a first straining segment formed after the first elastic limiting arm being reversely bent from a tail end of the first elastic segment in a direction of approaching the mounting bracket, a first support segment formed after the first elastic limiting arm extending from a tail end of the first straining segment in a direction opposite to an extending direction of the first elastic segment, and a tail end of the first support segment being coupled to the mounting bracket.

3. The spring of claim 2, wherein one end of the first elastic segment coupled to the contact part is fixed, and the other end inclines toward the mounting bracket.

4. The spring of claim 1, wherein the second elastic limiting arm comprises a second elastic segment formed after the second elastic limiting arm extends from the one end of the contact part proximate the mounting bracket, a second straining segment formed after the second elastic limiting arm being reversely bent from a tail end of the second elastic segment in the direction of approaching the mounting bracket, a second support segment formed after the second elastic limiting arm extending from a tail end of the second straining segment in a direction opposite to an extending direction of the second elastic segment, and a tail end of the second support segment being coupled to the mounting bracket.

5. The spring of claim 4, wherein one end of the second support segment coupled to the second straining segment is fixed, the other end inclines away from the contact part, a sliding part fixed at one end of the second support segment away from the second straining segment, a chute extending in the direction opposite to the extending direction of the second elastic segment disposed on an alar part, the sliding part fitted at a start end of the chute, and the sliding part capable of sliding along the chute toward a tail end of the chute when the fitting component is inserted into the spring and is elastically coupled to the contact part.

6. The spring of claim 5, wherein the start end of the chute is fixed, and the tail end of the chute inclines away from the contact part.

7. The spring of claim 5, wherein a surface of the sliding part in contact with an inner wall of the chute comprises an arc surface.

8. The spring of claim 4, wherein one end of the second elastic segment coupled to the contact part is fixed, and the other end inclines toward the the mounting bracket.

9. The spring of claim 1, wherein ends of the third elastic limiting arm and the fourth elastic limiting arm coupled to the contact part are fixed, and the other ends incline toward the mounting bracket.

10. The spring of claim 1, wherein a tail end of an alar part in the first direction is bent toward the contact part to form a limiting part.

11. The spring of claim 10, wherein the ends of the third elastic limiting arm and the fourth elastic limiting arm coupled to the contact part are fixed, wherein the other ends incline toward the mounting bracket and bend toward the limiting part to form a hook-shaped part, and wherein a surface of the hook-shaped part is proximal to a surface of the limiting part.

12. The spring of claim 1, wherein a surface on the contact part that is away from the mounting bracket comprises a convex spherical surface.

13. The spring of claim 1, wherein the spring is integrally formed using a stamping molding method.

14. A terminal, comprising:

a terminal body, a mounting groove being formed on the terminal body; and a camera mounted inside the mounting groove;

a spring disposed on one side of the mounting groove, the spring comprising:

a mounting bracket arranged in a first direction and fixed on the terminal body; and a contact part arranged in the first direction and coupled to the mounting bracket using four limiting arms, wherein the contact part is configured to press against a side wall of the camera, wherein the limiting arms each comprise one end affixed to the contact part and another end proximal to the mounting bracket, and wherein at least two of the elastic limiting arms ends proximal to the mounting bracket are slidable within the mounting bracket.

15. The terminal of claim 14, wherein the four elastic limiting arms comprise:

a first elastic limiting arm and a second elastic limiting arm oppositely disposed;

a third elastic limiting arm and a fourth elastic limiting arm oppositely disposed, wherein two ends of the first elastic limiting arm or the second elastic limiting arm are respectively fixedly coupled to the contact part and the mounting bracket, the third elastic limiting arm and the fourth elastic limiting arm extending from the one end of the contact part proximate the mounting bracket; and the mounting bracket further comprising alar parts disposed in a direction in which the third elastic limiting arm and the fourth elastic limiting arm extend, wherein tail ends of the third elastic limiting arm and the fourth elastic limiting arm press against inner side walls of the alar parts, and the tail ends of the third elastic limiting arm and the fourth elastic limiting arm are slidable along the inner side walls of the alar parts in a direction toward the mounting bracket when a fitting component is inserted into the spring and is elastically coupled to the contact part.

16. The terminal of claim 15, wherein the spring further comprises:

chutes in the alar parts obliquely extending in the direction from the extending direction of the second elastic limiting arm; and a sliding part disposed at the tail end of the second elastic limiting arm and slidable within the chutes when a fitting component is inserted into the spring and is elastically coupled to the contact part.

17. A spring, comprising:

a mounting bracket arranged in a first direction;

a contact part arranged in the first direction and coupled to the mounting bracket by four elastic limiting arms, the four elastic limiting arms disposed at an even interval on one end of the contact part proximate the mounting bracket;

the four elastic limiting arms comprising:

a first elastic limiting arm and a second elastic limiting arm oppositely disposed;

a third elastic limiting arm and a fourth elastic limiting arm oppositely disposed, wherein two ends of the first elastic limiting arm or the second elastic limiting arm are respectively fixedly coupled to the contact part and the mounting bracket, wherein the third elastic limiting arm and the fourth elastic limiting arm extend from the one end of the contact part proximate the mounting bracket; and the mounting bracket further comprising alar parts disposed in a direction in which the third elastic limiting arm and the fourth elastic limiting arm extend, wherein tail ends of the third elastic limiting arm and the fourth elastic limiting arm press against inner side walls of the alar parts, and the tail ends of the third elastic limiting arm and the fourth elastic limiting arm are slidable along the inner side walls of the alar parts in a direction approaching the mounting bracket when a fitting component is inserted into the spring and is elastically coupled to the contact part.

18. The spring of claim 17, wherein the first elastic limiting arm comprises:

a first elastic segment formed after the first elastic limiting arm extends from the one end of the contact part proximate the mounting bracket;

a first straining segment formed after the first elastic limiting arm reversely bent from a tail end of the first elastic segment in a direction of approaching the mounting bracket, a first support segment formed after the first elastic limiting arm extends from a tail end of the first straining segment in a direction opposite to an extending direction of the first elastic segment, and a tail end of the first support segment coupled to the mounting bracket.

19. The spring of claim 17, further comprising:

chutes in the alar parts obliquely extending in the direction opposite to the extending direction of the second elastic limiting arm; and a sliding part disposed at the tail end of the second elastic limiting arm and slidable within the chutes when a fitting component is inserted into the spring and is elastically coupled to the contact part.

20. The spring of claim 17, wherein a tail end of an alar part is bent in a direction of approaching the contact part to form a limiting part, and wherein ends of the third elastic limiting arm and the fourth elastic limiting arm coupled to the contact part are fixed, wherein the other ends incline toward the direction of approaching the mounting bracket, bend in a direction of approaching the limiting part to each form a hook-shaped part, and wherein a surface of a hook-shaped part is proximal to a surface of the limiting part.

* * * * *